United States Patent
Lee et al.

(10) Patent No.: US 7,666,710 B2
(45) Date of Patent: Feb. 23, 2010

(54) METHOD OF MANUFACTURING PHOTO COUPLERS

(75) Inventors: Ming-Jing Lee, Tucheng (TW); Shih-Jen Chuang, Taoyuan Hsien (TW); Chih-Hung Hsu, Tu Chen (TW); Yi-Hu Chao, Yonghe (TW)

(73) Assignee: Everlight Electronics Co., Ltd., Taipei Hsien (TW)

( * ) Notice: Subject to any disclaimer, the term of this patent is extended or adjusted under 35 U.S.C. 154(b) by 266 days.

(21) Appl. No.: 11/510,716

(22) Filed: Aug. 28, 2006

(65) Prior Publication Data

US 2007/0257342 A1    Nov. 8, 2007

(30) Foreign Application Priority Data

May 5, 2006    (TW) ............................. 95116151 A

(51) Int. Cl.
*H01L 21/76*    (2006.01)
(52) U.S. Cl. ................ 438/111; 438/123; 257/E25.006; 257/E23.042
(58) Field of Classification Search ................ 438/111, 438/112, 123; 257/E23.031, E23.042, E25.004, 257/E25.006
See application file for complete search history.

(56) References Cited

U.S. PATENT DOCUMENTS

| | | | |
|---|---|---|---|
| 4,412,135 A | 10/1983 | Awaji | |
| 5,321,305 A * | 6/1994 | Sakamoto | ................... 257/666 |
| 5,770,867 A * | 6/1998 | Sata et al. | ..................... 257/81 |
| 5,796,559 A | 8/1998 | Joe | |
| 6,571,040 B2 | 5/2003 | Paris | |
| 6,947,620 B2 | 9/2005 | Florin | |

FOREIGN PATENT DOCUMENTS

| | | |
|---|---|---|
| JP | 01-215564 | 8/1989 |
| JP | 2117182 A | 5/1990 |
| JP | 2001141969 | 5/2001 |
| JP | 2002057365 A | 2/2002 |
| JP | 2003133498 | 5/2003 |
| TW | 541807 | 7/2003 |
| TW | 548885 | 8/2003 |
| TW | 569051 | 1/2004 |

* cited by examiner

*Primary Examiner*—Matthew C Landau
*Assistant Examiner*—Candice Y Chan
(74) *Attorney, Agent, or Firm*—Muncy, Geissler, Olds & Lowe, PLLC

(57) ABSTRACT

A method of manufacturing photo couplers is provided. At first, a receiver lead-frame array is cut from a lead-frame matrix having a transmitter lead-frame array and the receiver lead-frame array. Then, the receiver lead-frame array is overturned and placed on the lead-frame matrix to allow light-receiver elements on the receiver lead-frame array to face light-emitting elements on the transmitter lead-frame array of the lead-frame matrix. Finally, the receiver lead-frame array and the lead-frame matrix are connected.

4 Claims, 5 Drawing Sheets

METHOD OF MANUFACTURING PHOTO COUPLERS

RELATED APPLICATIONS

The present application is based on, and claims priority from, Taiwan Application Serial Number 95116151, filed May 5, 2006, the disclosure of which is hereby incorporated by reference herein in its entirety.

BACKGROUND

1. Field of Invention

The present invention relates to a method of manufacturing photo couplers. More particularly, the present invention relates to a method of manufacturing face-to-face structure photo couplers.

2. Description of Related Art

Photo couplers utilize light to transmit electronic signal. A photo coupler comprises a transmitter and a receiver. Firstly, an electronic signal triggers a light-emitting element such as a light emitting diode (LED) on the transmitter to emit light With a fixed wavelength. Then, the light is received by a light-receiving element on the receiver to reverse back to an electronic signal. The electronic signal is properly amplified to compensate transmission loss. Because a signal is transmitted by means of light from a transmitter to a receiver in a photo coupler, the photo coupler has good isolation to noise and can be used to prevent crosstalk between electronic signal from transmitter end and electronic signal from receiver end.

Because of the good isolation property of the photo couplers, the photo couplers are widely used in various circuits and become one of the most popular electronic devices.

However, because huge amount of consumption of photo couplers mass-manufactured by numerous producers, the price of photo couplers is getting cheaper and it is more difficult to generate profit. The production cost control of photo couplers becomes important for manufacturers to generate profit from photo couplers in such cheap price. The major cost in producing photo couplers is material cost. Therefore, there is a need to reduce the material cost of photo couplers to increase profit.

SUMMARY

It is therefore an aspect of the present invention to provide a method of manufacturing photo couplers, which can reduce the production cost of the photo couplers and thus increase the profit thereof. Moreover, because the production cost is reduced, the price of the photo couplers can be cheaper.

In accordance with the foregoing and other aspects of the present invention, a method of manufacturing photo couplers is provided. At first, a receiver lead-frame array is cut from a lead-frame matrix having a transmitter lead-frame array and the receiver lead-frame array. Then, the receiver lead-frame array is overturned and placed on the lead-frame matrix to allow light-receiving elements on the receiver lead-frame array to face light-emitting elements on the transmitter lead-frame array of the lead-frame matrix. Finally, the receiver lead-frame array and the lead-frame matrix are connected.

In accordance with the foregoing and other aspects of the present invention, a method of manufacturing photo couplers is provided. At first, a transmitter lead-frame array is cut from a lead-frame matrix having a receiver lead-frame array and the transmitter lead-frame array. Then, the transmitter lead-frame array is overturned and placed on the lead-frame matrix to allow light-emitting elements on the transmitter lead-frame array to face light-receiving elements on the receiver lead-frame array of the lead-frame matrix. Finally, the transmitter lead-frame array and the lead-frame matrix are connected.

In accordance with the foregoing and other aspects of the present invention, a method of manufacturing photo couplers is provided. At first, a receiver lead-frame array is cut from a lead-frame matrix having a transmitter lead-frame array and the receiver lead-frame array. Then, the lead-frame matrix is overturned and placed on the receiver lead-frame array to allow light-emitting elements on the transmitter lead-frame array of the lead-frame matrix to face light-receiving elements on the receiver lead-frame array. Finally, the lead-frame matrix and the receiver lead-frame array are connected.

In accordance with the foregoing and other aspects of the present invention, a method of manufacturing photo couplers is provided. At first, a transmitter lead-frame array is cut from a lead-frame matrix having a receiver lead-frame array and the transmitter lead-frame array. The lead-frame matrix is overturned and placed on the transmitter lead-frame array to allow light-receiving elements on the receiver lead-frame array of the lead-frame matrix to face light-emitting elements on the transmitter lead-frame array. Finally, the lead-frame matrix and the transmitter lead-frame array are connected.

In conclusion, transmitter lead-frames and receiver lead-frames are integrated to a lead-frame matrix. The space of the lead-frame matrix is well utilized. Therefore, lead-frame density is increased in the lead-frame matrix. More lead-frames can be produced on the lead-frame. The production cost of photo coupler is reduced and the profit thereof is increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The major cost of producing photo couplers is material cost. Therefore, the invention reduces the material cost to reduce the overall cost of producing photo couplers.

In the traditional method of manufacturing photo couplers, transmitter lead-frames and receiver lead-frames are manufactured separately on two lead-frame matrixes. The area on lead-frame matrix is not well utilized.

In the method of manufacturing photo couplers of the invention, transmitter lead-frames and lead-frames are integrated on one lead-frame matrix. Therefore, the lead-frame density of the lead-frame matrix is increased. The lead-frame matrix is used efficiently.

Figure 1:
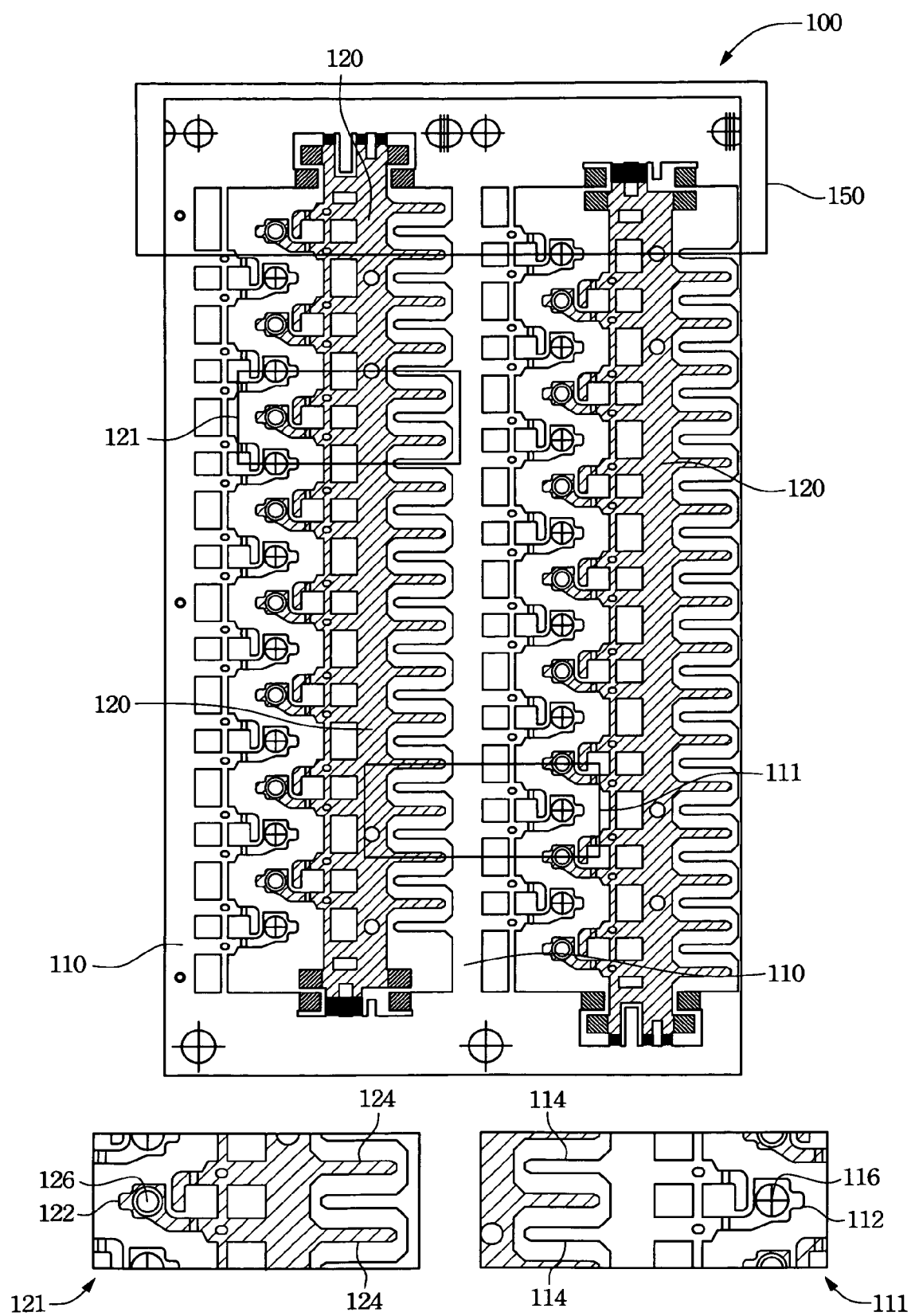
FIG. 1 is a structural drawing of a lead-frame matrix of photo couplers according to a preferred embodiment of the invention.

FIG. 1 is a structural drawing of a lead-frame matrix of photo couplers according to a preferred embodiment of the invention. In FIG. 1, the lead-frame matrix of photo couplers 100 has multiple rows of transmitter lead-frame arrays 110 and multiple rows of receiver lead-frame arrays 120. Each transmitter lead-frame array 110 comprises multiple transmitter lead-frames 111. Each transmitter lead-frame 111 comprises a transmitter side 112, two transmitter pins 114 and a light-emitting element 116 on the transmitter side 112. Each receiver lead-frame array 120 comprises multiple receiver lead-frames 121. Each receiver lead-frame 121 comprises a receiver side 122, two receiver pins 124 and a light-receiver element 126 on the receiver side 122. The light-transmitter element 116 generally is a light transmitter diode (LED). The light-receiver element 126 is a photo diode, a photo transistor or a light-receiver integrated circuit (IC).

In FIG. 1, transmitter lead-frame arrays 110 and receiver lead-frame arrays 120 are located side by side on the lead-frame matrix of photo couplers 100. The transmitter sides 112 of the transmitter lead-frame arrays 110 are adjacent to the receiver sides 122 of the receiver lead-frame arrays 120. The transmitter pins 114 of the transmitter lead-frame arrays 110 are adjacent to the receiver pins 124 of the receiver lead-frame arrays 120. The transmitter sides 112 of the transmitter lead-frame arrays 110 and the receiver sides 122 of the receiver lead-frame array 120 are alternatively inserted. The transmitter sides 112 can be fit into the space between two adjacent receiver sides 122, and the receiver sides 122 can be fit into the space between two adjacent transmitter sides 112. The transmitter pins 114 of the transmitter lead-frame arrays 110 and the receiver pins 124 of the receiver lead-frame array 120 are alternatively inserted. The transmitter pins 114 can be fit into the space between two adjacent receiver pins 124, and the receiver pins 124 can be fit into the space between two adjacent the transmitter pins 114. In this structure of the lead-frame matrix of the embodiment of FIG. 1, the lead-frame matrix can be utilized efficiently. The lead-frame matrix has higher density of lead-frames. Half more lead-frames than what available on traditional lead-frame matrix can be produced based on this invention. Therefore, the waste of the lead-frame matrix can be reduced and the production cost can also be reduced.

Figure 2:
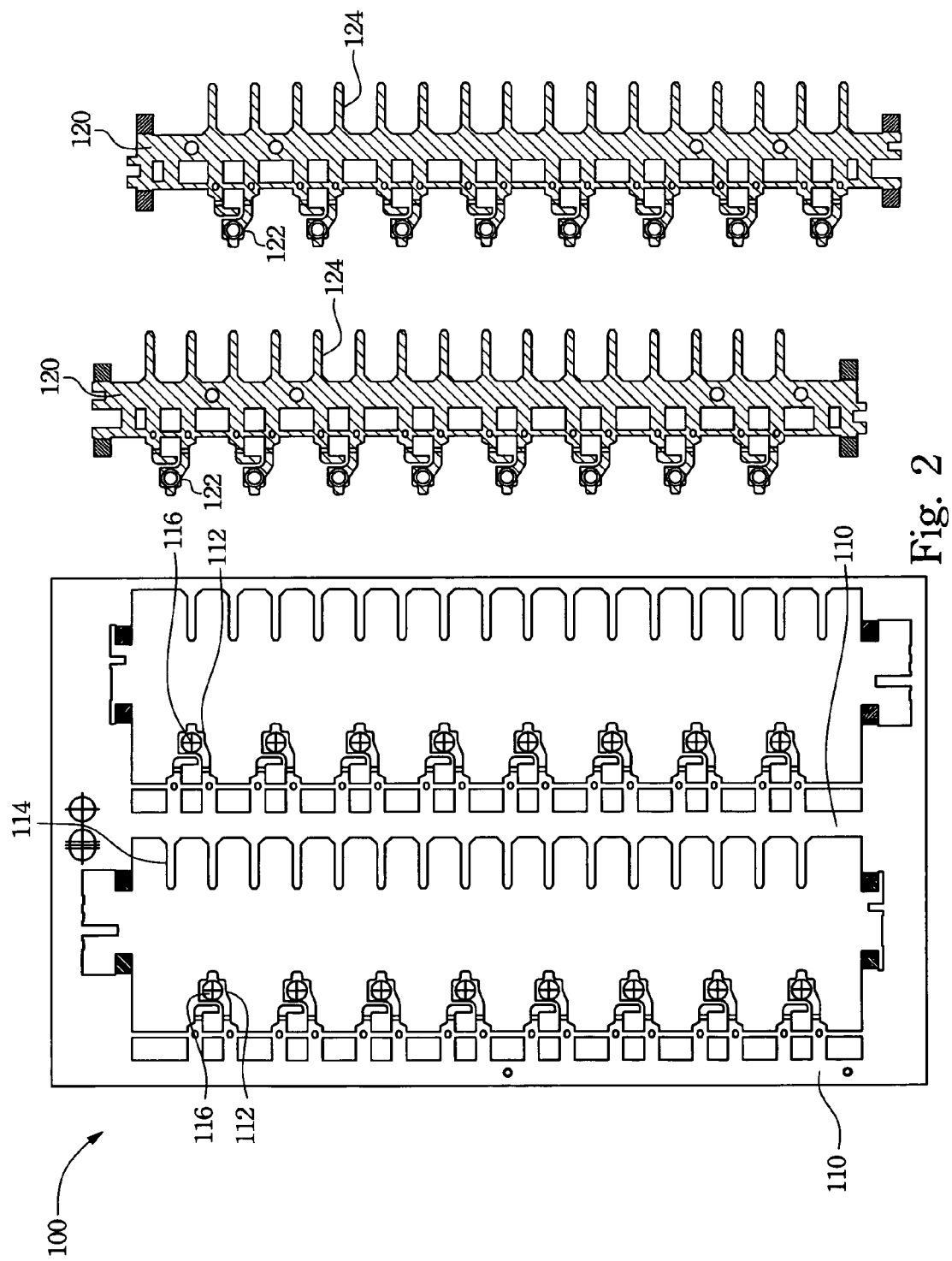
FIG. 2-4 are a lead-frame matrix of photo couplers in each process according to a preferred embodiment of the invention.
Figure 3:
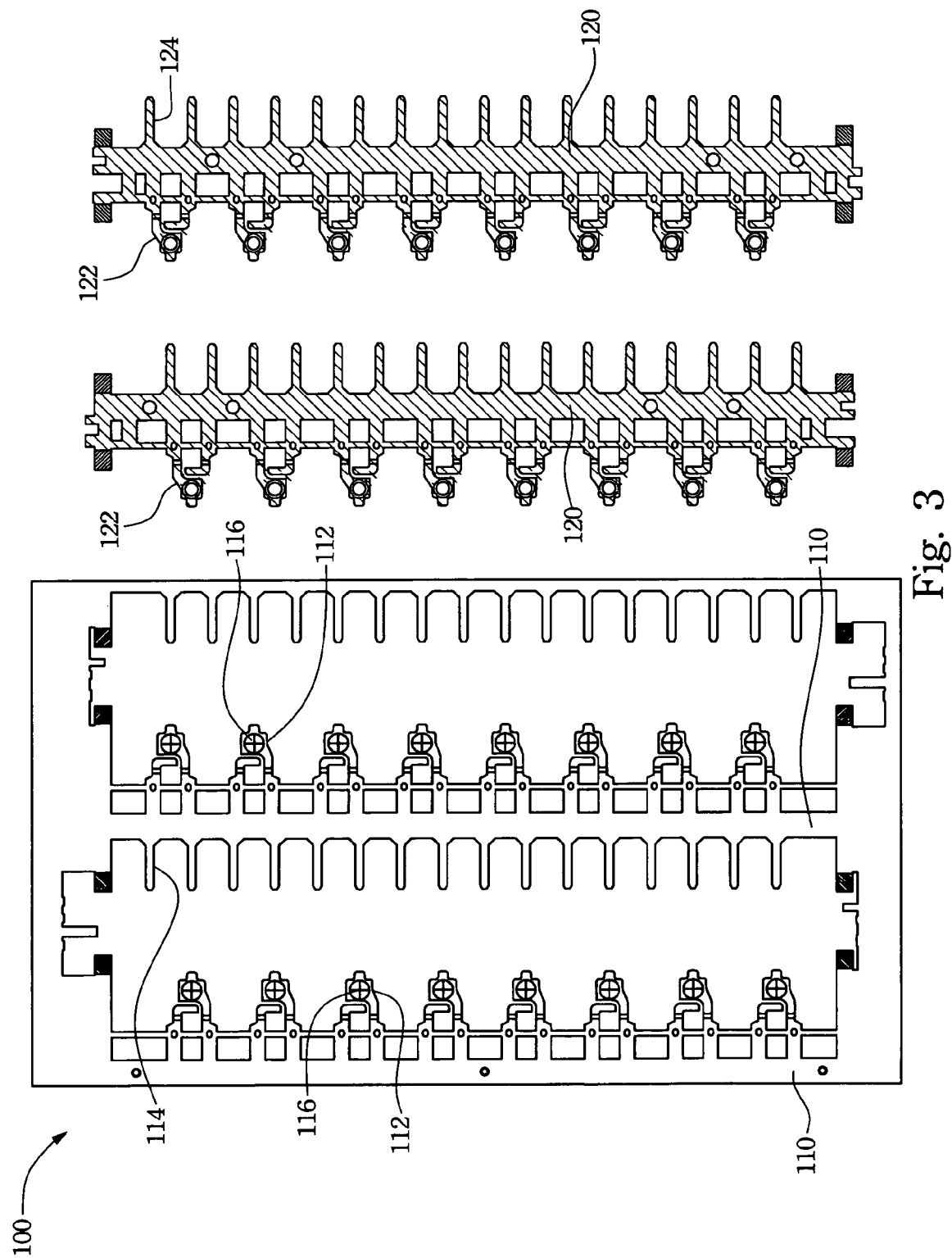
Figure 4:
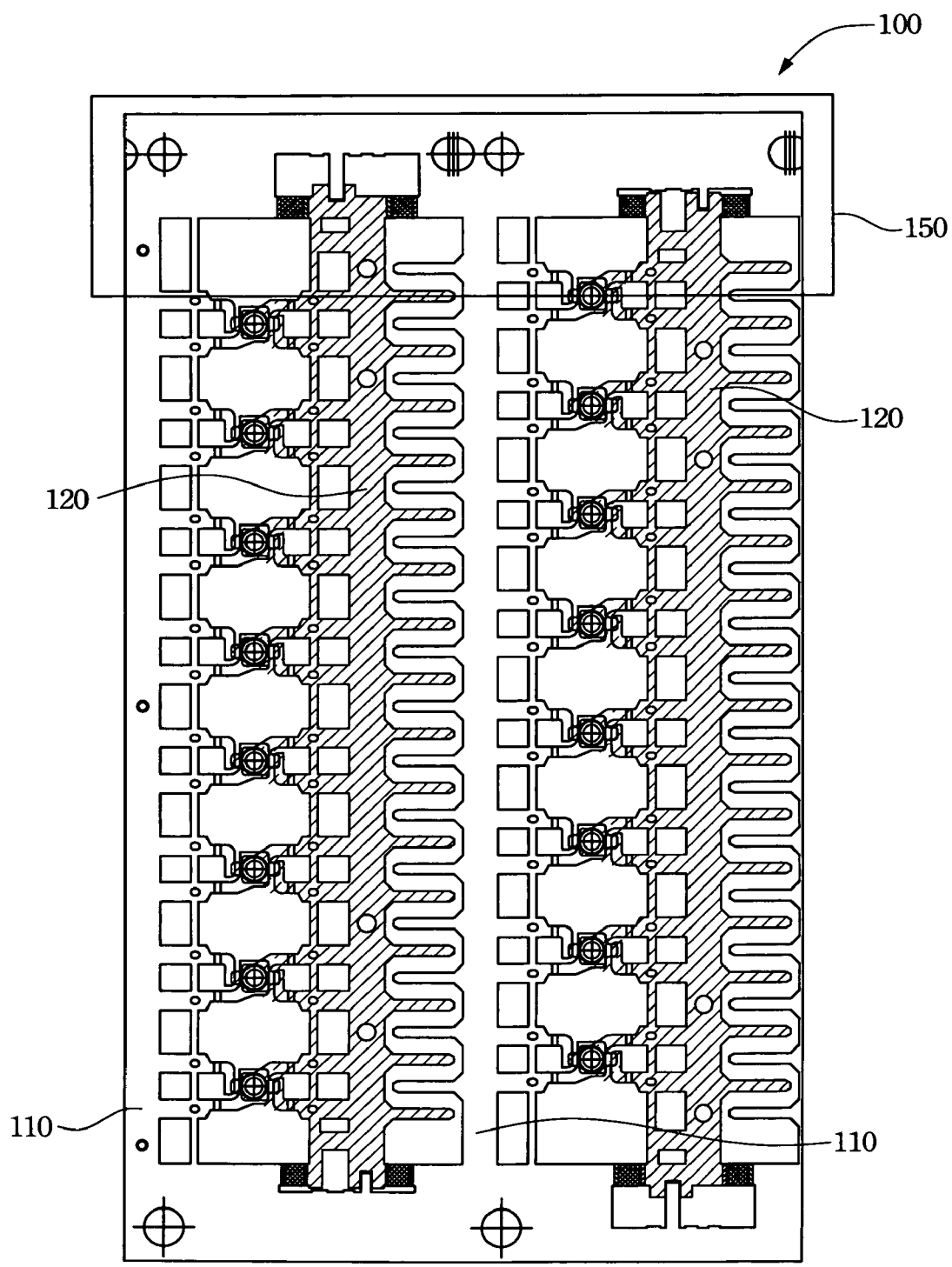

FIG. 2-4 are a lead-frame matrix of photo couplers in each process according to a preferred embodiment of the invention. In FIG. 2, a receiver lead-frame array 120 is cut from a lead-frame matrix 100. In FIG. 3, the receiver lead-frame array 120 is overturned to have light-receiving elements thereon facing down. In FIG. 4, the receiver lead-frame array 120 is placed on the lead-frame matrix 110 to allow light-receiving elements thereon to face light-emitting elements on the transmitter lead-frame array 110 of the lead-frame matrix 100. Finally, the receiver lead-frame array 120 and the lead-frame matrix 100 are connected.

In another embodiment, the transmitter lead-frame array 110 is cut instead of the receiver lead-frame array 120. In this embodiment, a transmitter lead-frame array 110 is cut from a lead-frame matrix 100 and then overturned to have light-emitting elements thereon facing down. The transmitter lead-frame array 110 is placed on the lead-frame matrix 100 to allow light-emitting elements thereon to face light-receiving elements on the receiver lead-frame array 120 of the lead-frame matrix 100. Finally, the transmitter lead-frame array 110 and the lead-frame matrix 100 are connected.

In still another embodiment, the lead-frame matrix 100 is overturned instead of the lead-frame array. In this embodiment, a transmitter lead-frame array 110 or a receiver lead-frame array 120 is selectively cut from a lead-frame matrix 100. If the transmitter lead-frame array 110 is cut, the lead-frame matrix 100 is overturned and placed on the transmitter lead-frame array 110 to allow light-receiving elements on the receiver lead-frame array 120 of the lead-frame matrix 100 to face light-emitting elements on the transmitter lead-frame array 110. Finally, the lead-frame matrix 100 and the transmitter lead-frame array 110 are connected.

If the receiver lead-frame array 120 is cut, the lead-frame matrix 100 is overturned and placed on the receiver lead-frame array 120 to allow light-emitting elements on the transmitter lead-frame array 110 of the lead-frame matrix 100 to face light-receiving elements on the receiver lead-frame array 120. Finally, the lead-frame matrix 100 and the receiver lead-frame array 110 are connected.

The light-emitting elements 116 on the transmitter lead-frame array 110 needs to precisely face light-receiving elements 126 on the receiver lead-frame array 120, otherwise the performance of the photo coupler will be decreased. Therefore, both the receiver lead-frame array 120 and the lead-frame matrix 100 have locating designs thereon to ensure they can be precisely connected face-to-face. In order to explain how the receiver lead-frame array 120 and the lead-frame matrix are connected, the locating areas 150 of FIG. 1 and FIG. 4 will be expanded as shown in FIG. 5 and FIG. 6.

Figure 5:
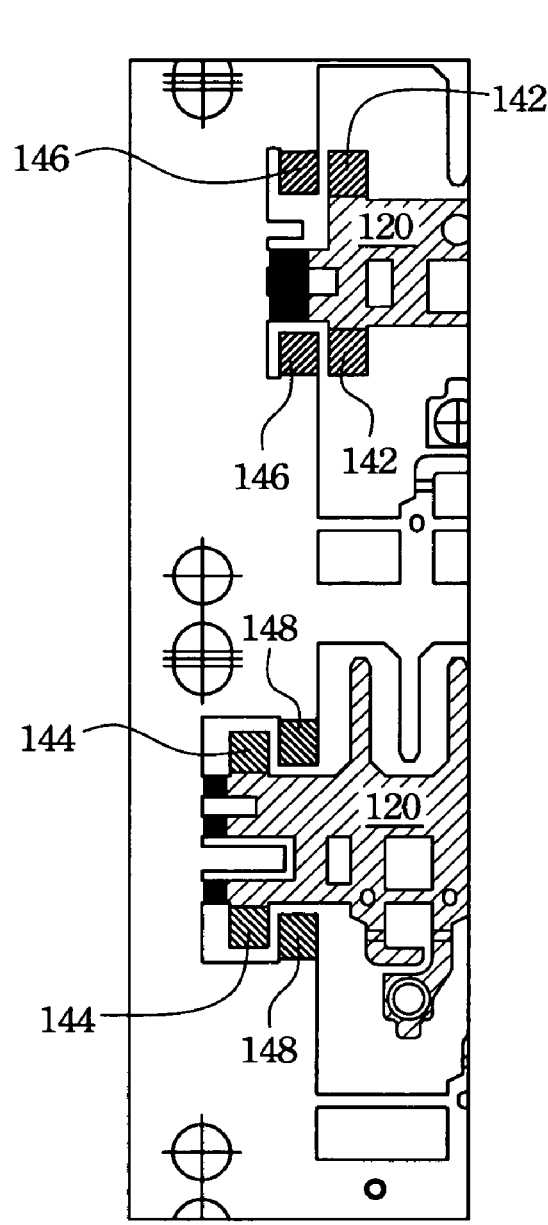
FIG. 5-6 are enlarged drawings of locating areas of a lead-frame matrix of photo couplers according to a preferred embodiment of the invention.
Figure 6:
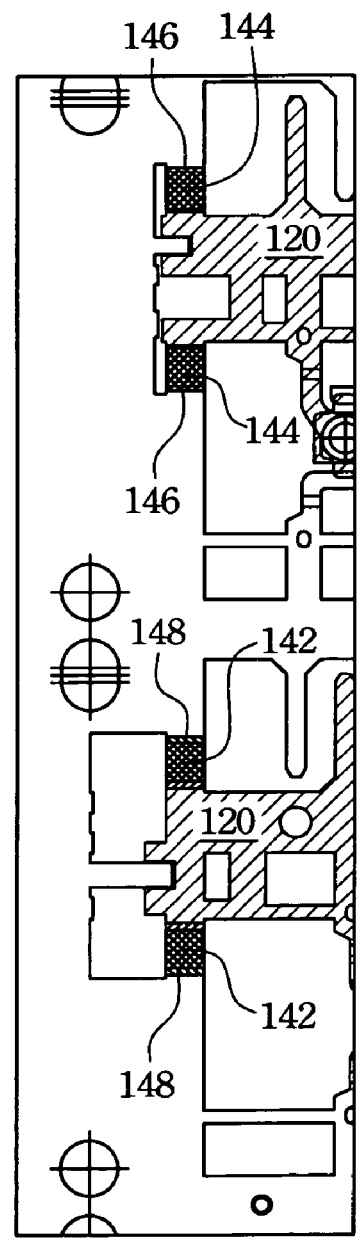

FIG. 5-6 are enlarged drawings of locating areas of a lead-frame matrix of photo couplers according to a preferred embodiment of the invention. FIG. 5 is an enlarged drawing of the locating area 150 of FIG. 1. There are a first press-connecting section 142 and a second press-connecting section 144 on the receiver lead-frame array 120. There are a third press-connecting section 146 and a fourth press-connecting section 148 on the lead-frame matrix 100.

FIG. 6 is an enlarged drawing of the locating area 150 of FIG. 4. The receiver lead-frame array 120 is cut and overturned to be placed on the lead-frame matrix 100. The second press-connecting section 144 of the receiver lead-frame array 120 and the third press-connecting section 146 of the lead-frame matrix 100 are pressed to be connected with each other. The first press-connecting section 142 of the receiver lead-frame array 120 and the first press-connecting section 148 of the lead-frame matrix 100 are pressed to be connected with each other. Then, the receiver lead-frame array 120 and the lead-frame matrix 100 are welded together to obtain firm connection.

In the embodiment of FIG. 5-6, the locating designs are designed on the receiver lead-frame array 120. In other embodiment, the locating designs can be on the transmitter lead-frame array 110.

Accordingly, the present invention has the following advantages.

(1) The structure of the lead-frame matrix of photo couplers of the invention can reduce the production cost and thus increase the profit of the photo couplers. Moreover, because the production cost is reduced, the price of the photo coupler can be cheaper.

(2) Transmitter lead-frames and lead-frames of photo couplers are integrated on one single lead-frame matrix. Therefore, the lead-frame density of the lead-frame matrix can be increased. The lead-frame matrix is used efficiently.

The preferred embodiments of the present invention described above should not be regarded as limitations to the present invention. It will be apparent to those skilled in the art that various modifications and variations can be made to the present invention without departing from the scope or spirit of the invention. The scope of the present invention is as defined in the appended claims.

What is claimed is:

1. A method of manufacturing photo couplers, comprising:
providing a substrate having receiver lead-frames and transmitter lead-flames, each of the receiver lead-frames having two first pins and a first side, each of the transmitter lead-frames having two second pins and a second side, wherein the first side of each of the receiver lead-frames and the second side of each of the transmitter lead-frames are arranged alternately with a distance and the first pins of each of the receiver lead-frames and the second pins of each of the transmitter lead-frames are arranged transversely outwardly;

disposing a light-receiving element on the first side of each of the receiver lead-frames and a light-transmitting element on the second side of each of the transmitter lead-frames respectively;

cutting ones of the receiver lead-frames and the transmitter lead-frames from the substrate and flipping the cut ones upside-down;

aligning the ones of the receiver lead-frames and the transmitter lead-frames cut from the substrate to another ones of the receiver lead-frames and the transmitter lead-frames remaining on the substrate such that the light-transmitting element on each of the second sides faces to the light-receiving element on each of the first sides; and fastening the ones of the receiver lead-frames and the transmitter lead-frames cut onto the substrate.

2. The method of claim 1, wherein the step of aligning the ones of the receiver lead-frames and the transmitter lead-frames cut from the substrate to the another ones of the receiver lead-frames and the transmitter lead-frames remaining on the substrate is in a manner of arranging the first pins of each of the receiver lead-frames and the second pins of each of the transmitter lead-frames transversely outwardly.

3. The method of claim 2, wherein the ones of the receiver, lead-frames and the transmitter lead-frames cut from the substrate are fastened onto a first press-connecting section of the substrate.

4. The method of claim 3, wherein the ones of the receiver lead-frames and the transmitter lead-frames comprise a second press-connecting section used for connecting with the first press-connecting section of the substrate.

* * * * *